United States Patent
Liao et al.

(10) Patent No.: US 8,240,882 B2
(45) Date of Patent: Aug. 14, 2012

(54) LIGHT EMITTING DIODE MODULE AND METHOD FOR MAKING THE SAME

(75) Inventors: Tsung-Jen Liao, Pan Chiao (TW);
Chung-Kai Wang, Pan Chiao (TW);
Yuan-Hsin Liu, Pan Chiao (TW);
Yao-Tsung Hsu, Pan Chiao (TW)

(73) Assignee: Bright LED Electronics Corp., Taipei Hsien (TW)

( * ) Notice: Subject to any disclaimer, the term of this patent is extended or adjusted under 35 U.S.C. 154(b) by 31 days.

(21) Appl. No.: 12/968,660

(22) Filed: Dec. 15, 2010

(65) Prior Publication Data

US 2011/0157897 A1    Jun. 30, 2011

(30) Foreign Application Priority Data

Dec. 25, 2009   (TW) .............................. 98145003 A

(51) Int. Cl.
*F21V 33/00* (2006.01)
(52) U.S. Cl. .................................. 362/249.02; 362/800
(58) Field of Classification Search ............. 362/249.02, 362/800, 97.3, 612, 555, 311.02, 218, 294, 362/373
See application file for complete search history.

(56) References Cited

U.S. PATENT DOCUMENTS

| | | | |
|---|---|---|---|
| 2003/0189830 A1* | 10/2003 | Sugimoto et al. | 362/294 |
| 2007/0268703 A1* | 11/2007 | Gasquet et al. | 362/294 |
| 2009/0116252 A1* | 5/2009 | Kille et al. | 362/373 |
| 2009/0159905 A1* | 6/2009 | Chen | 257/88 |
| 2010/0157612 A1* | 6/2010 | Hirose et al. | 362/382 |

FOREIGN PATENT DOCUMENTS

| CN | 2613048 Y | 4/2004 |
|---|---|---|
| CN | 201285010 Y | 8/2009 |

* cited by examiner

*Primary Examiner* — Laura Tso
(74) *Attorney, Agent, or Firm* — Steptoe & Johnson LLP

(57) ABSTRACT

A light emitting diode module includes: a printed circuit board including an upper circuit layer, a lower metal layer, an insulating layer, and a plurality of through holes; a metallic heat sink formed with a plurality of chip-support portions and disposed below the printed circuit board; a thermal connection layer that has lower and upper surfaces respectively bonded to the heat sink and the lower metal layer of the printed circuit board; and a plurality of light emitting diode chips, each of which is placed in contact with and bonded to one of the chip-support portions and each of which is electrically connected to the upper circuit layer. A method for making the light emitting diode module is also disclosed.

21 Claims, 5 Drawing Sheets

LIGHT EMITTING DIODE MODULE AND METHOD FOR MAKING THE SAME

CROSS-REFERENCE TO RELATED APPLICATION

This application claims priority of Taiwanese application no. 098145003, filed on Dec. 25, 2009.

BACKGROUND OF THE INVENTION

1. Field of the Invention

This invention relates to a light emitting diode module, more particularly to a light emitting diode module having improved heat dissipation efficiency and to a method for making the light emitting diode module.

2. Description of the Related Art

Light emitting diodes (LEDs) have properties of relatively long service life, low contamination, low power consumption, compact size, relatively fast reaction, etc. Thus, in recent years, an LED module formed by mounting the LEDs on a printed circuit board has been used for replacing a conventional light source.

When the current LED module is in use, only about 20 percent of the energy applied to the LED module is converted to light emanation, and about 80 percent of the energy is converted to heat energy. With the improving of the luminance and power of the LEDs, an issue concerning how to improve the heat dissipation efficiency of the LEDs becomes more and more important. If the LED module cannot dissipate the heat energy efficiently, a luminous decay of the LEDs would happen, thereby limiting the applications of the LED module.

Referring to FIG. 1, a conventional LED module with a heat dissipation structure for a display is disclosed in Taiwanese patent publication no. 200722840, and includes a back plate 10, a printed circuit board 11 and a LED package 13. The printed circuit board 11 is disposed on the back plate 10 and includes a circuit layer 111, a heat-resistant plastic layer 112, and a through hole 113 penetrating the circuit layer 111 and the heat-resistant plastic layer 112 and for extension of a protrusion 101 of the back plate 10. The LED package 13 includes a metal seat 131, an LED chip 132 and an insulative packaging member 133. The metal seat 131 has a lower surface 1311 aligned with the through hole 113 and connected with the protrusion 101 of the back plate 10. The LED chip 132 is attached to an upper surface of the metal seat 131 and is electrically connected to the circuit layer 111. The metal seat 131 is surrounded by the insulative packaging member 133. By disposing the LED chip 132 on the upper surface of the metal seat 131, the heat generated from the LED chip 132 can be conducted to the back plate 10 via the metal seat 131.

However, the provision of the metal seat 131 will increase the total thickness of the LED module. Moreover, after long-term use, the insulative packaging member 133 is likely to degrade or discolor to cause a luminous decay of the LED module and to damage the electrical connection between the LED chip 132 and the circuit layer 111, such that the lifetime of the LED module is shortened.

A planar light source device as shown in FIG. 2 has been proposed in U.S. patent application publication no. 2009-0242908 A1. The planar light source device includes a metal substrate 15, a printed circuit board 16 disposed on the metal substrate 15, and a plurality of LED chips 17 separately disposed on the printed circuit board 16. The planar light source device can provide relatively good heat-dissipation efficiency by modifying a thickness of the metal substrate 15 and by controlling areas of the LED chips 17 and the distance between any two adjacent ones of the LED chips 17. However, in this case, the thickness of the metal substrate 15 is required to be larger than 1 mm, and thus, the flexibility of the planar light source device is relatively poor. On the other hand, if the thickness of the metal substrate 15 is reduced, the heat generated by the LED chips 17 cannot be dissipated efficiently.

SUMMARY OF THE INVENTION

Therefore, an object of the present invention is to provide a light emitting diode module that has an improved heat-dissipating efficiency, and that is relatively thin, lightweight, and flexible.

According to one aspect of the present invention, there is provided a light emitting diode module, comprising:
  a printed circuit board including an upper circuit layer, a lower metal layer, an insulating layer disposed between the upper circuit layer and the lower metal layer, and a plurality of through holes each penetrating the upper circuit layer, the lower metal layer and the insulating layer;
  a metallic heat sink formed with a plurality of chip-support portions on an upper surface thereof and disposed below the printed circuit board so that the chip-support portions are aligned with the through holes;
  a thermal connection layer that has lower and upper surfaces respectively bonded to the heat sink and the lower metal layer of the printed circuit board; and
  a plurality of light emitting diode chips, each of which is placed in contact with and bonded to one of the chip-support portions and each of which is electrically connected to the upper circuit layer.

According to another aspect of the present invention, there is provided a method for making a light emitting diode module comprising:
  (a) providing a printed circuit board that includes an upper circuit layer, a lower metal layer, an insulating layer disposed between the upper circuit layer and the lower metal layer, and a plurality of through holes each penetrating the upper circuit layer, the lower metal layer and the insulating layer;
  (b) providing a metallic heat sink that has an upper surface formed with a plurality of chip-support portions;
  (c) thermal bonding the lower metal layer to the upper surface of the heat sink;
  (d) attaching a plurality of light emitting diode chips respectively to the chip-support portions by placing the light emitting diode chips in contact with the respective chip-support portions; and
  (e) electrically connecting the light emitting diode chips to an upper circuit layer of the printed circuit board.

According to still another aspect of the present invention, there is provided a light emitting diode module comprising:
  a printed circuit board including an upper circuit layer, a lower metal layer, an insulating layer disposed between the upper circuit layer and the lower metal layer, and a plurality of through holes each penetrating the upper circuit layer, the lower metal layer and the insulating layer;
  a metallic heat sink disposed below the printed circuit board; and
  a plurality of light emitting diode chips, each of which is placed in contact with and bonded to the heat sink through one of the through holes and each of which has two bonding wires connected directly and electrically to the upper circuit layer.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
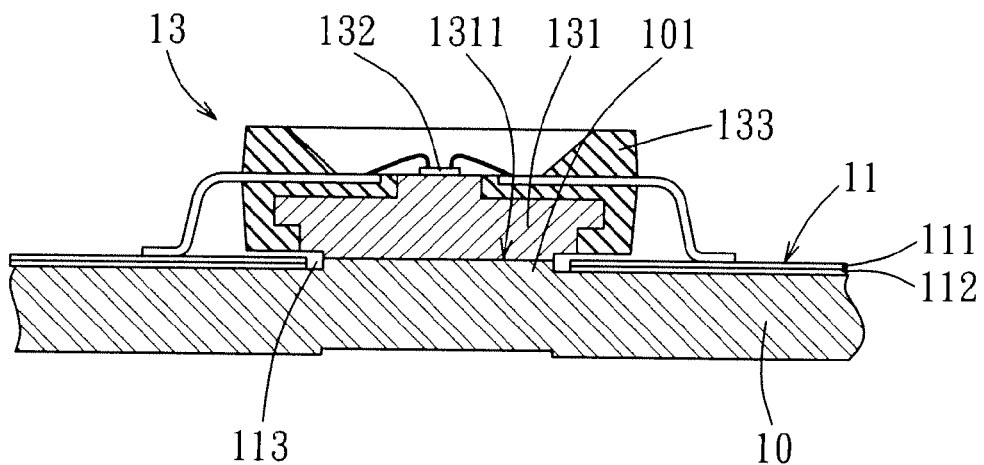
FIG. 1 is a cross-sectional view of a conventional light emitting diode module disclosed in Taiwanese patent publication no. 200722840.
Figure 2:
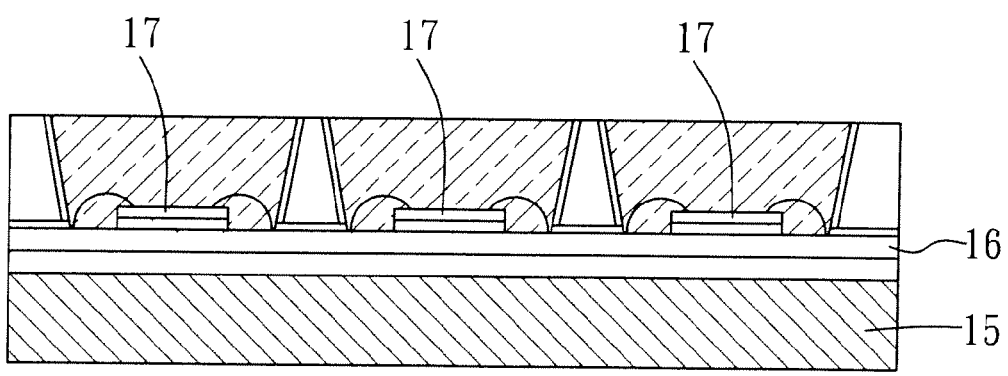
FIG. 2 is a cross-sectional view of a planar light source device disclosed in U.S. patent application publication no. 2009-0242908 A1.

Before the present invention is described in greater detail with reference to the accompanying preferred embodiments, it should be noted herein that like elements are denoted by the same reference numerals throughout the disclosure.

Figure 3:
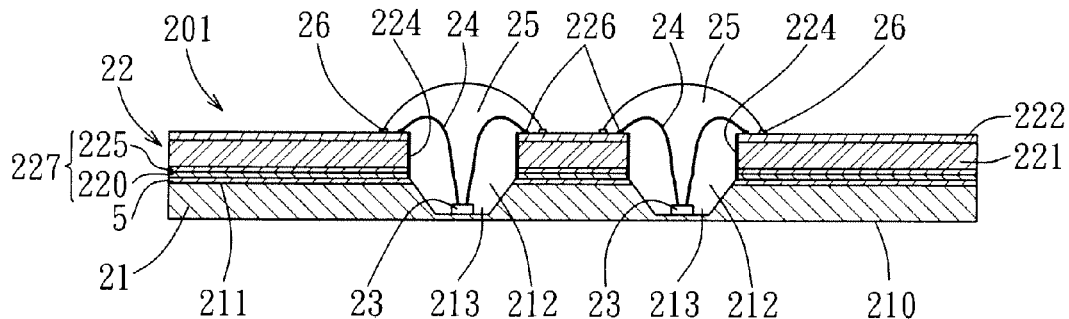
FIG. 3 is a cross-sectional view of the first preferred embodiment of a light emitting diode module according to the present invention.

Referring to FIG. 3, a light emitting diode module 201 of the first preferred embodiment according to the present invention includes a metallic heat sink 21, a printed circuit board 22, a plurality of light emitting diode chips (LED chips) 23, a plurality of light-transmissive encapsulants 25, and a thermal connection layer 5. The heat sink 21 and the printed circuit board 22 are bonded to each other by respectively bonding to lower and upper surfaces of the thermal connection layer 5. Each of the LED chips 23 is placed on the heat sink 21, is exposed from the printed circuit board 22, and is electrically connected to the printed circuit board 22.

Figure 6:
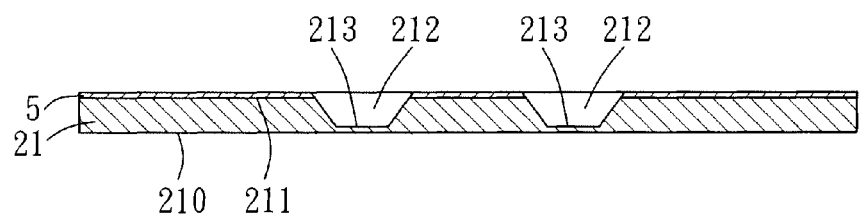
FIG. 6 is a cross-sectional view illustrating a metallic heat sink of the first preferred embodiment of the light emitting diode module according to the present invention.

In more detail, referring to FIGS. 3 and 6, the metallic heat sink 21 includes a lower surface 210, an upper surface 211 opposite to the lower surface 210, and a plurality of chip-support portions 213. In this embodiment, the chip-support portions 213 are defined by a plurality of recesses 212 that are spaced apart from each other and that are dented from the upper surface 211. The recesses 212 may be formed by stamping the metallic heat sink 21, and no protrusion due to the stamping is formed to protrude from the lower surface 210 of the metallic heat sink 21. In other words, the lower surface 210 of the metallic heat sink 21 is still a substantially planar surface. In this embodiment, the chip-support portions 213 are defined by bottom surfaces of the recesses 212 on which the LED chips 23 are disposed, and thus, the level of the chip-support portions 213 is lower than that of the upper surface 211 of the metallic heat sink 21.

Preferably, an inner peripheral wall of each of the recesses 212 is formed into a reflecting surface by coating a reflecting material thereon or by means of the reflecting property of the metal material used for making the metallic heat sink 21 so that the recesses 212 can respectively serve as reflecting cups to enhance the illumination effect of the LED chips 23 placed in contact with and bonded to the chip-support portions 213. In the preferred embodiment, the metallic heat sink 21 may have a thickness ranging from 0.4 mm to 1.0 mm, so that the heat sink 21 is flexible.

Figure 5:
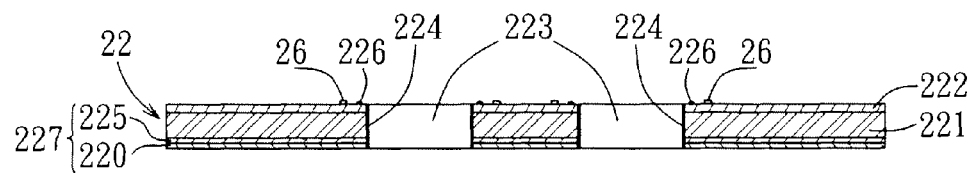
FIG. 5 is a cross-sectional view illustrating a printed circuit board of the first preferred embodiment of the light emitting diode module according to the present invention.

Referring to FIGS. 3 and 5, the printed circuit board 22 includes an insulating layer 221, an upper circuit layer 222, a lower metal layer 227, a plurality of through holes 223, and a plurality of reflecting coatings 224. The insulating layer 221 is disposed between the upper circuit layer 222 and the lower metal layer 227. Each of the through holes 223 penetrates the upper circuit layer 222, the lower metal layer 227 and the insulating layer 221, and has a peripheral wall defining a space communicated with the corresponding one of the recesses 212. That is, the upper circuit layer 222 and the lower metal layer 227 will not appear in the through holes 223. The lower metal layer 227 may be a single-layered or a multi-layered structure. In this embodiment, the lower metal layer 227 includes a metal film 225 disposed on the insulating layer 221 and a metal coating 220 disposed on the metal film 225 and thermally bonded to the metallic heat sink 21. The metal coating 220 is formed by an electroplating process and is thermally bonded to the metallic heat sink 21 by soldering the metal coating 220 to the metallic heat sink 21 using a solder material. In other embodiments, the metal coating 220 may be bonded to the heat sink 21 by fusion bonding the metal coating 220 to the metallic heat sink 21. In the first preferred embodiment, the printed circuit board 22 is flexible and has a thickness ranging from 0.15 mm to 1.6 mm. The reflecting coatings 224 are respectively coated on the corresponding peripheral walls of the through holes 223. For example, the reflecting coatings 224 are respectively formed on the corresponding peripheral walls of the through holes 223 by electroplating a silver layer thereon.

Figure 4:
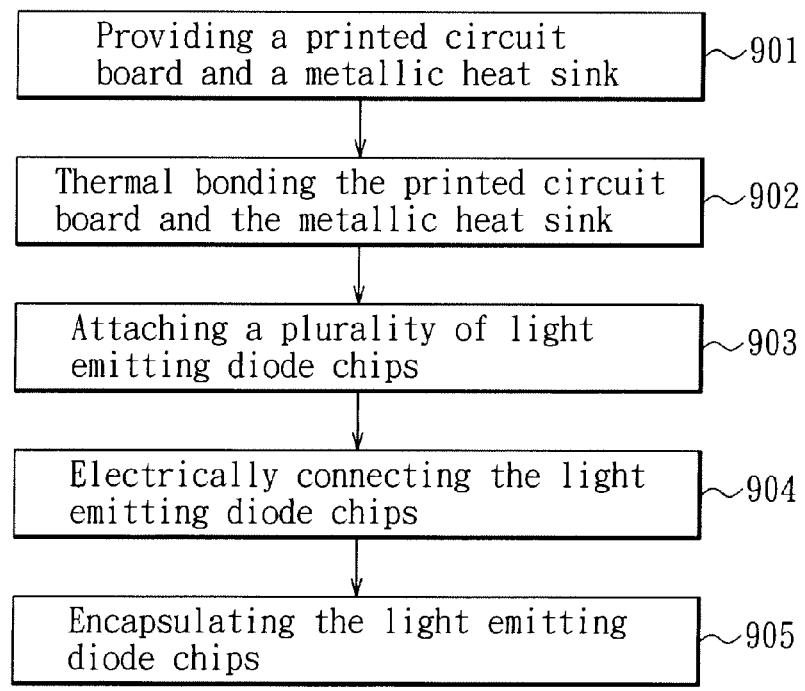
FIG. 4 is a flow chart showing the preferred embodiment of a method for making a light emitting diode module according to the present invention.

FIG. 4 illustrates a flow chart for making the first preferred embodiment of the light emitting diode module 201 according to the present invention.

Figure 7:
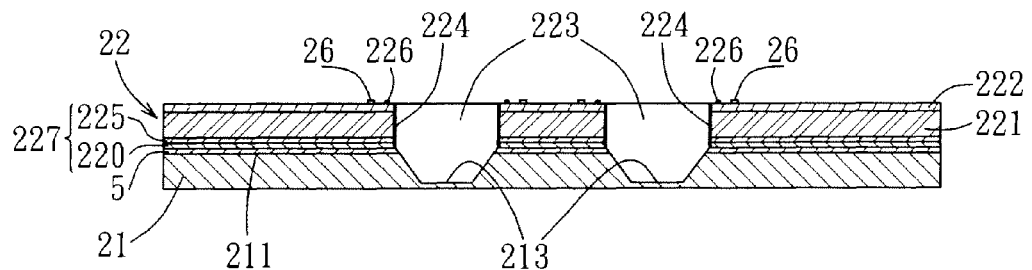
FIG. 7 is a cross-sectional view illustrating bonding of the printed circuit board to the heat sink in the first preferred embodiment of the light emitting diode module according to the present invention.

In steps 901 and 902, the printed circuit board 22 and the metallic heat sink 21 are provided and thermally bonded together with the thermal connection layer 5 formed therebetween (see FIG. 7). Preferably, in the first preferred embodiment, the thermal connection layer 5 is formed from a solder material to bond together the printed circuit board 22 and the metallic heat sink 21 so that an upper surface of the thermal connection layer 5 of the solder material is bonded to the printed circuit board 22, and so that a lower surface of the thermal connection layer 5 of the solder material is bonded to the upper surface 211 of the metallic heat sink 21. When the metallic heat sink 21 and the printed circuit board 22 are bonded together, each of the through holes 223 of the printed circuit board 22 is aligned with the corresponding recess 212 of the metallic heat sink 21. Furthermore, after the metallic heat sink 21 and the printed circuit board 22 are bonded together, a solder reflow process may be conducted to enhance the bonding strength therebetween.

It should be noted that since the printed circuit board 22 is bonded to the metallic heat sink 21 by soldering, properties of the constituting materials of the metal film 220 of the printed circuit board 22 and the upper surface 211 of the metallic heat sink 21 should be taken into consideration. Accordingly, when the metal coating 220 of the printed circuit board 22 is made of copper or iron, the upper surface 211 of the metallic heat sink 21 preferably includes tin, silver, or nickel, while when the metal coating 220 of the printed circuit board 22 is made of aluminum, the upper surface 211 of the metallic heat sink 21 preferably includes nickel. Inclusion of tin, silver, or nickel in the upper surface 211 of the metallic heat sink 21 means that the metallic heat sink 21 is wholly made of tin, silver, or nickel or that the metallic heat sink 21 includes a layer of tin, silver, or nickel serving as the upper surface 211 thereof.

In step 903, the LED chips 23 are respectively attached to the chip-support portions 213 by placing the LED chips 23 in contact with the respective chip-support portions 213 using silver paste. In other embodiments, as long as the LED chips 23 can be attached to the chip-support portions 213, other materials, for example, epoxy resin or silicone resin, may be used instead of the silver paste.

In step 904, positive and negative electrodes (not shown) of each of the LED chips 23 are respectively and electrically connected to connecting pads 226 on the upper circuit layer 222 of the printed circuit board 22 via metal bonding wires 24.

In step 905, the LED chips 23 are encapsulated by a plurality of light-transmissive encapsulants 25. Each of the light-transmissive encapsulants 25 is formed by filling and overflowing each of the through holes 223 and the recesses 212 with an encapsulating gel (liquid state) using, for example, a dispenser or injecting device until each of the LED chips 23 (including the two bonding wires 24) is encapsulated by the overflowing portion of the encapsulating gel, followed by curing the encapsulating gel. The light-transmissive encapsulants 25 may be made of epoxy resin or other light-transmissive materials such as silicone resin or UV paste.

In the step 905, in order to prevent the encapsulating gel from flowing arbitrarily, the upper circuit layer 222 of the printed circuit board 22 is preferably formed with a plurality of ring-shaped flanges 26 by using a mimeography process. Each of the light-transmissive encapsulants 25 projects upwardly around a corresponding one of the through holes 223, and thus, has a peripheral end terminating along a corresponding one of the flanges 26.

As mentioned above, by attaching the LED chips 23 directly on the metallic heat sink 21 and electrically connecting the LED chips 23 to the upper circuit layer 222, and by thermal bonding the printed circuit board 22 and the metallic heat sink 21 together by virtue of the thermal connection layer 5, routes of heat dissipation and electrical connection for each of the LED chips 23 may be separated from each other, and the heat generated by the LED chips 23 may dissipate downwardly to the metallic heat sink 21 and outwardly from the heat sink 21.

In addition, since the inner peripheral walls of the recesses 212 of the metallic heat sink 21 may directly serve as reflecting cups, a luminous decay arising from aging of the materials of the encapsulants 25 as a result of exposure to light from the LED chips 23 may be alleviated, since the reflecting cups are formed in the heat sink 21.

Figure 12:
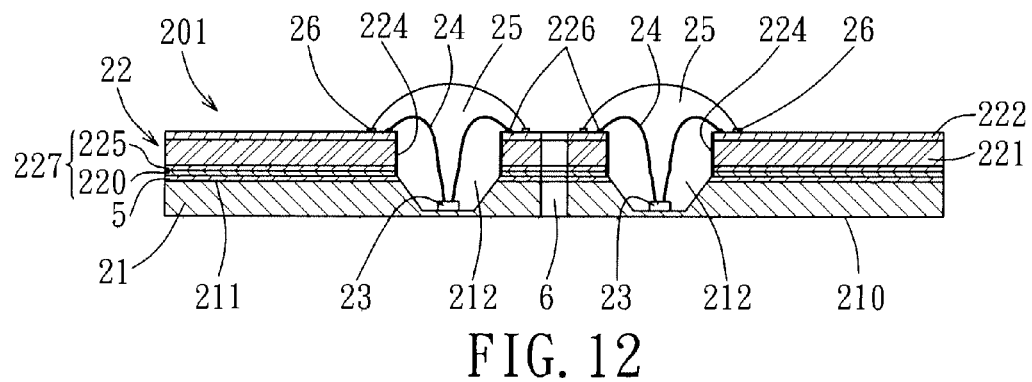
FIG. 12 is a cross-sectional view of yet another modification of the first preferred embodiment according to the present invention.

Furthermore, since the metallic heat sink 21 and the printed circuit board 22 are flexible, the light emitting diode module 201 is adapted to be disposed on a variety of irregular surfaces so as to widen the application fields of the light emitting diode module 201. As shown in FIG. 12, in order to increase flexibility of the light emitting diode module 201, the printed circuit board 22 and the heat sink 21 may be formed with a plurality of perforated holes 6, each of the perforated holes 6 extending through the printed circuit board 22 and the heat sink 21, i.e., each of the perforated holes 6 extends through the light emitting diode module 201.

Since the LED chips 23 are disposed on the chip-support portions 213 at relatively lower positions, the thickness of the light emitting diode module 201 may be reduced. Moreover, a total thickness of the metallic heat sink 21 and the printed circuit board 22 may be reduced to less than 4 mm, and a distance between two adjacent ones of the LED chips 23 may be narrowed to 16 mm. Therefore, by the structure of the light emitting diode module 201, not only can the thickness of the light emitting diode module 201 be reduced, but the volume of the light emitting diode module 201 can be sufficiently utilized or the size of the light emitting diode module 201 can be reduced. Accordingly, the light emitting diode module 201 complies with the trend toward thinner and lighter electronic products, and can serve as a lighting element of a flexible light emitting diode lamp.

Figure 8:
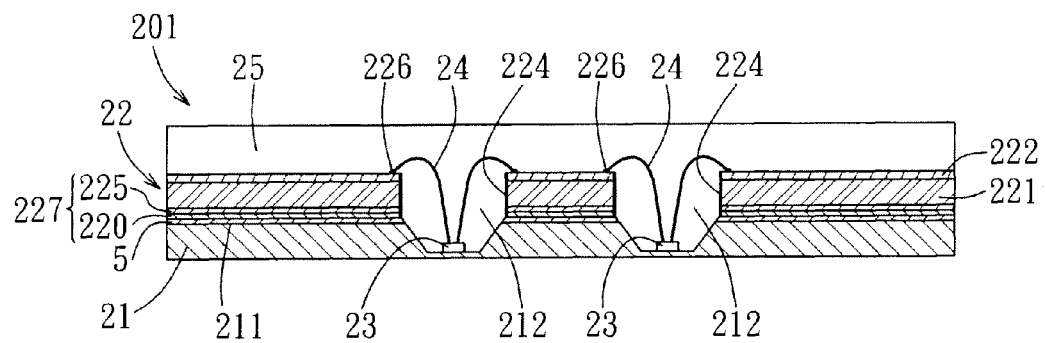
FIG. 8 is a cross-sectional view of a modification of the first preferred embodiment according to the present invention.

Referring to FIG. 8, in a modification of the first preferred embodiment according to the present invention, the light-transmissive encapsulants 25 may entirely cover the upper surface of the printed circuit board 22 to protect the circuits thereon from being contaminated.

Figure 9:
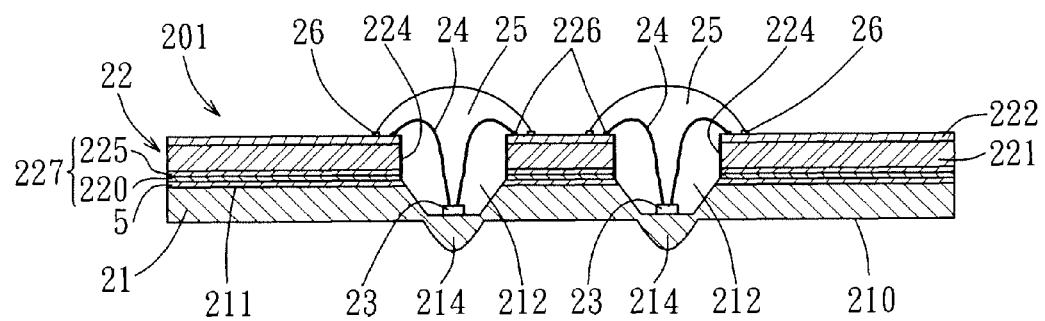
FIG. 9 is a cross-sectional view of a further modification of the first preferred embodiment according to the present invention.

Although in the light emitting diode module 201 shown in FIG. 3, no protrusions shown to protrude from the lower surface 210 of the metallic heat sink 21, in a modification of the light emitting diode module 201 shown in FIG. 9, a plurality of protrusions 214 may be formed on the lower surface 210 of the metallic heat sink 21. Each of the protrusions 214 protrudes from the corresponding one of the bottom surfaces of the recesses 212.

Figure 10:
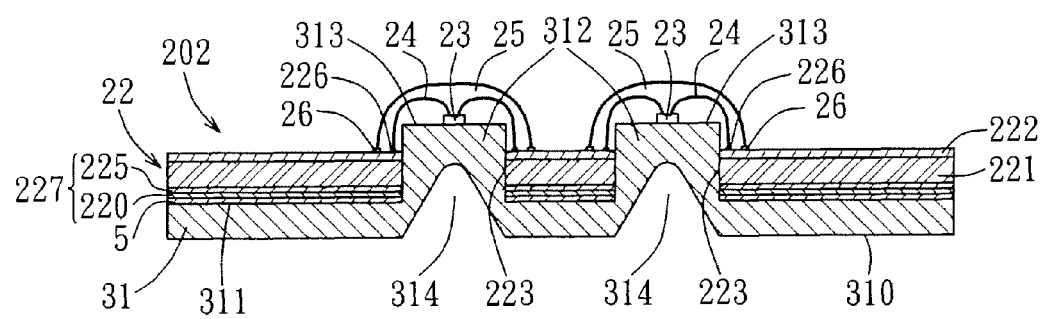
FIG. 10 is a cross-sectional view of another modification of the first preferred embodiment according to the present invention.

FIG. 10 shows a light emitting diode module 202 that is another modification of the first preferred embodiment, and that has a metallic heat sink 31 different from that of the light emitting diode module 201 of FIG. 3.

The metallic heat sink 31 includes a lower surface 310, an upper surface 311, and a plurality of chip-support portions 313. In this modification, the lower and upper surfaces 310, 311 are two opposite surfaces of the metallic heat sink 31, and the chip-support portions 313 are defined by a plurality of protrusions 312 that are spaced apart from each other and that protrude from the upper surface 311 of the heat sink 31. Furthermore, because the protrusions 312 are formed by stamping the metallic heat sink 31 from the lower surface 310 thereof, the metallic heat sink 31 is formed with a plurality of cavities 314 dented from the lower surface 310.

Since the protrusions 312 protrude from the upper surface 311, each of the protrusions 312 is able to extend through and be exposed from a corresponding one of the through holes 223 after the printed circuit board 22 is bonded to the upper surface 311 of the heat sink 31. Thus, in this modification, the LED chips 23 are respectively disposed on top surfaces of the protrusions 312 and are electrically connected to the upper circuit layer 222 of the printed circuit board 22. By the modified structure, the routes of heat dissipation and electrical connection for each of the LED chips 23 in the light emitting diode module 202 may be separated from each other. Besides, by forming the cavities 314 in the lower surface 310, heat dissipation area of the metallic heat sink 31 may be increased.

Figure 11:
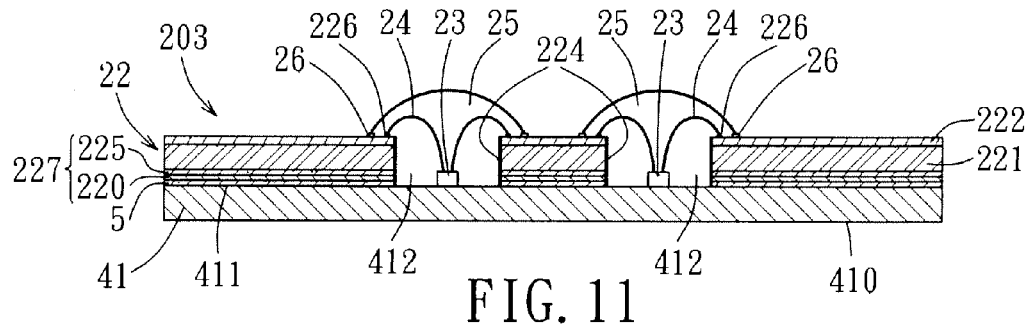
FIG. 11 is a cross-sectional view of still another modification of the first preferred embodiment according to the present invention.

FIG. 11 shows a light emitting diode module 203 that is still another modification of the first preferred embodiment, and that has a metallic heat sink 41 different from that of the light emitting diode module 201 of FIG. 3.

In the metallic heat sink 41, lower and upper surfaces 410, 411 are two opposite surfaces of the metallic heat sink 41, and are both planar surfaces. In other words, a plurality of chip-support portions 412 and the upper surface 411 are coplanar. By the modified structure, the routes of heat dissipation and electrical connection for each of the LED chips 23 in the light emitting diode module 202 may be separated from each other to provide a good heat dissipation property.

Figure 13:
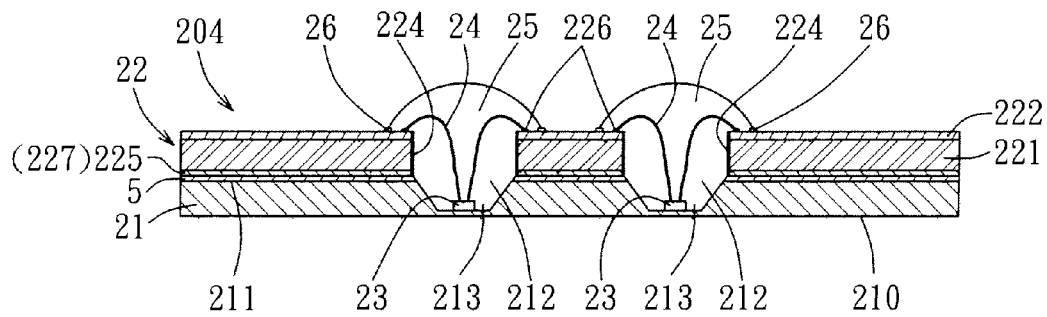
FIG. 13 is a cross-sectional view of the second preferred embodiment of a light emitting diode module according to the present invention.

Referring to FIG. 13, a light emitting diode module 204 of the second preferred embodiment according to the present invention includes a metallic heat sink 21, a printed circuit board 22, a plurality of light emitting diode chips (LED chips) 23, and a thermal connection layer 5. The heat sink 21 and the printed circuit board 22 are bonded to each other by respectively bonding to lower and upper surfaces of the thermal connection layer 5. Each of the LED chips 23 is placed on the heat sink 21, is exposed from the printed circuit board 22, and is electrically connected to the printed circuit board 22.

The second embodiment differs from the first embodiment only in that no metal coating 220 is formed and that the thermal connection layer 5 is formed by fusion bonding the lower metal layer 227 composed of the lower copper film 225 and the upper surface 211 of the metallic heat sink 21.

In summary, the light emitting diode module 201, 202, 203, or 204 according to the present invention may separate the routes of the heat dissipation and the electrical connection by bonding the printed circuit board 22 and the metallic heat sink 21, 31, or 41 one above the other, and by disposing the LED chips 23 on the metallic heat sink 21, 31, or 41 while electrically connecting the LED chips 23 to the printed circuit board 22. Accordingly, the heat generated from the LED chips 23 may dissipate directly and downwardly to the heat sink 21, 31, or 41 to dissipate outwardly. Thus, the light emitting diode module 201, 202, 203, or 204 may provide good heat dissipation, and thereby, not only can the performance of the light emitting diode module 201, 202, 203, or 204 be increased, but the light emitting diode module 201, 202, 203, or 204 can have a more flexible circuit design.

Moreover, in the light emitting diode module 201, 202, 203, or 204 according to the present invention, the thicknesses of the printed circuit board 22 and the metallic heat sink 21, 31, or 41 and the distance between any adjacent two of the LED chips 23 may be respectively designed to be thinner and narrower, and thus, the light emitting diode module 201, 202, 203, 204 complies with the trend toward thinner and lighter electronic products. Furthermore, the light emitting diode module 201, 202, 203, or 204 includes the printed circuit board 22 and the metallic heat sink 21, 31, or 41 that are flexible, and thus, can be widely applied to various electronic products. In addition, when making the light emitting diode module 201, 202, 203, or 204, the printed circuit board 22 and the metallic heat sink 21, 31, or 41 may be firmly bonded to each other by solder bonding or fusion bonding. The light emitting diode module 201, 202, 203, or 204 can thus achieve the object of the present invention to provide a light emitting diode module that has an improved heat-dissipating efficiency, and that is relatively thin, lightweight, and flexible.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting diode module, comprising:
   a printed circuit board including an upper circuit layer, a lower metal layer, an insulating layer disposed between said upper circuit layer and said lower metal layer, and a plurality of through holes each penetrating said upper circuit layer, said lower metal layer and said insulating layer;
   a metallic heat sink formed with a plurality of chip-support portions on an upper surface thereof and disposed below said printed circuit board so that said chip-support portions are aligned with said through holes;
   a thermal connection layer that has lower and upper surfaces respectively bonded to said heat sink and said lower metal layer of said printed circuit board; and
   a plurality of light emitting diode chips, each of which is placed in contact with and bonded to one of said chip-support portions and each of which is electrically connected to said upper circuit layer.

2. The light emitting diode module of claim 1, wherein said thermal connection layer is formed by fusion bonding said lower metal layer and said heat sink.

3. The light emitting diode module of claim 1, wherein said thermal connection layer is formed from a solder material to bond together said lower metal layer and said heat sink.

4. The light emitting diode module of claim 3, wherein said solder material includes tin, said lower metal layer includes one of copper and iron, and said upper surface of said heat sink includes one of tin, silver and nickel.

5. The light emitting diode module of claim 3, wherein said solder material includes tin, said lower metal layer includes aluminum, and said upper surface of said heat sink includes nickel.

6. The light emitting diode module of claim 1, wherein said upper surface of said heat sink includes a metal layer made of a metal different from that of said heat sink.

7. The light emitting diode module of claim 1, wherein each of said chip-support portions is a recess dented from said upper surface of said heat sink.

8. The light emitting diode module of claim 1, wherein each of said chip-support portions is a protrusion protruding from said upper surface of said heat sink to extend through a corresponding one of said through holes.

9. The light emitting diode module of claim 1, wherein said chip-support portions and said upper surface of said heat sink are coplanar.

10. The light emitting diode module of claim 1, wherein said printed circuit board has a thickness ranging from 0.15 mm to 1.6 mm.

11. The light emitting diode module of claim 1, wherein said heat sink has a thickness ranging from 0.4 mm to 1.0 mm.

12. The light emitting diode module of claim 1, wherein said heat sink and said printed circuit board are flexible.

13. The light emitting diode module of claim 12, wherein said printed circuit board and said heat sink are formed with a plurality of perforated holes each extending through said printed circuit board and said heat sink to increase flexibility of said light emitting diode module.

14. The light emitting diode module of claim 1, further comprising a plurality of light-transmissive encapsulants each encapsulating a corresponding one of said light emitting diode chip, said upper circuit layer of said printed circuit board further including a plurality of ring-shaped flanges each projecting upwardly around a corresponding one of said through holes, each of said light-transmissive encapsulants having a peripheral end terminating along said flanges.

15. A method for making a light emitting diode module comprising:
- (a) providing a printed circuit board that includes an upper circuit layer, a lower metal layer, an insulating layer disposed between the upper circuit layer and the lower metal layer, and a plurality of through holes each penetrating the upper circuit layer, the lower metal layer and the insulating layer;
- (b) providing a metallic heat sink that has an upper surface formed with a plurality of chip-support portions;
- (c) thermal bonding the lower metal layer to the upper surface of the heat sink;
- (d) attaching a plurality of light emitting diode chips respectively to the chip-support portions by placing the light emitting diode chips in contact with the respective chip-support portions; and
- (e) electrically connecting the light emitting diode chips to an upper circuit layer of the printed circuit board.

16. The method of claim 15, wherein, after the step (c), the step (d) is conducted by placing the light emitting diode chips onto the respective chip-support portions through the respective through holes.

17. The method of claim 15, wherein the lower metal layer is thermal bonded to the upper surface of the heat sink by fusion bonding the lower metal layer and the heat sink.

18. The method of claim 15, wherein the lower metal layer is thermal bonded to the upper surface of the heat sink by soldering the lower metal layer to the heat sink using a soldering material.

19. The method of claim 15, wherein the chip-support portions are formed by stamping the heat sink.

20. The method of claim 15, wherein the upper surface of the heat sink is formed by depositing a metal layer on the heat sink.

21. A light emitting diode module, comprising:
- a printed circuit board including an upper circuit layer, a lower metal layer, an insulating layer disposed between said upper circuit layer and said lower metal layer, and a plurality of through holes each penetrating said upper circuit layer, said lower metal layer and said insulating layer;
- a metallic heat sink disposed below said printed circuit board; and
- a plurality of light emitting diode chips, each of which is placed in contact with and bonded to said heat sink through one of said through holes and each of which has two bonding wires connected directly and electrically to said upper circuit layer.

* * * * *